United States Patent
Huang et al.

(10) Patent No.: US 6,291,305 B1
(45) Date of Patent: Sep. 18, 2001

(54) METHOD FOR IMPLEMENTING RESISTANCE, CAPACITANCE AND/OR INDUCTANCE IN AN INTEGRATED CIRCUIT

(75) Inventors: Chi-Jung Huang, Saratoga; Helen Peng, Sunnyvale; Ken Ming Li, Santa Clara, all of CA (US)

(73) Assignee: S3 Graphics Co., Ltd., Cayman Islands, BWI (KY)

( * ) Notice: Subject to any disclaimer, the term of this patent is extended or adjusted under 35 U.S.C. 154(b) by 0 days.

(21) Appl. No.: 09/330,788

(22) Filed: Jun. 11, 1999

(51) Int. Cl.[7] ................................................ H01L 21/20
(52) U.S. Cl. ........................................................... 438/381
(58) Field of Search ........................................ 438/380, 128, 438/129, 381, 584, 588, 618, 622; 257/531, 532, 533

(56) References Cited

U.S. PATENT DOCUMENTS 5,874,770 * 8/1999 Saia et al. .............................. 257/536
5,936,298 * 8/1999 Capocelli et al. ..................... 257/531

* cited by examiner

Primary Examiner—David Nelms
Assistant Examiner—Quoc Hoang
(74) Attorney, Agent, or Firm—Carr & Ferrell LLP

(57) ABSTRACT

On-chip resistance, capacitance and/or inductance is implemented in an integrated circuit in vertical configurations using stacked vias and medullization layers within the integrated circuit. Column shaped openings or vias are formed within the integrated circuit and connect from a silicon substrate to various metal traces. The vias are filled with conductive material such as platinum or tungsten. Parallel vias are used to form capacitance, while multiple vias and metal traces are arranged in various patterns over several planes in order to form resistance and/or inductance. The use of the stacked vias and metal traces in a vertical fashion reduces lateral spacing required to implement on-chip resistance, capacitance and/or inductance and allows for more efficient use of space in very large scale integration.

8 Claims, 5 Drawing Sheets

METHOD FOR IMPLEMENTING RESISTANCE, CAPACITANCE AND/OR INDUCTANCE IN AN INTEGRATED CIRCUIT

FIELD OF THE INVENTION

The present invention generally relates to integrated semiconductor circuits. More particularly, the present invention relates to an on-chip method for implementing resistors, capacitors and inductors in an integrated circuit using vertical stack vias and interconnects.

BACKGROUND OF THE INVENTION

An integrated circuit, sometimes referred to as a chip, an IC, or semiconductor device, is an intricate microscopic map of transistors and other microscopic components programmed along electrical interconnections. The transistors and other microscopic components are formed on a silicon substrate, while the electrical interconnections, are typically formed layer by layer on the semiconductor substrate.

Using techniques well known in the art of semiconductor fabrication, transistor elements and other devices are fabricated on the silicon substrate. The transistors are then connected by interconnects which could be poly silicon and metals. The combination of these transistors and interconnects forms the integrated circuit on the silicon substrate. Typically, the integrated circuit will include a plurality of electrical interconnections which are arranged in a pattern. Often, due to limited spacing requirements, this pattern will require overlapping traces. On a single flat surface, it is impossible to implement this trace pattern and so conductive layers are disposed in an overlapping pattern as necessary separated by insulators.

The metal layers are typically composed of aluminum or aluminum compounds and represent the electrical interconnections between the components which are formed on the silicon substrate. These metal layers are separated from other conductive layers and devices formed on the silicon substrate by an interlevel dielectric isolation (ILD) layer. This ILD layer typically includes silicon dioxide.

The metal layers are connected to one another, and to regions on the silicon substrate, by use of conductive holes which are formed perpendicular to the substrate and are commonly known as "vias". These vias are microscopic column shaped openings which are formed to join metals on different layers. The vias are filled with a conductive material such as aluminum or refractory metal such as tungsten. An outermost passivation layer protects the underlying layers of the integrated circuit. Typically, the outermost passivation layer is formed using chemical vapor deposition techniques well known in the art of integrated circuit fabrication.

Often, resistance, capacitance and/or inductance is needed in a circuit, including an integrated circuit. This can be accomplished in an integrated circuit by fabricating on-chip resistors or capacitors in the integrated circuit or providing off-chip resistors, capacitors and inductors. To the extent that inductance is possible on a conventional integrated circuit, the inductance is that associated with the field built around a single trace. FIG. 1 shows a planarized schematic view of a prior art integrated circuit which includes a resistor 202 and a capacitor 208. The integrated circuit includes a silicon substrate 200, upon which multiple devices (not shown). To form the resistor 202 a pattern can be formed, the dimensions of the pattern in relation to the sheet resistance of the structure, which is conventionally specified in units of ohms per square ($\Omega/\square$), represents the resistance of the structure. Accordingly, the resistance of such a pattern is directly proportional to the length of the trace or the number of squares in the trace. Depending upon the desired resistance of the structure it can be formed of metal, doped silicon, doped polysilicon and can be formed using techniques well known in the art of semiconductor fabrication. However, attainable values of sheet resistance are such that resistors in the kilo ohm range and higher require lengthy patterns containing many squares. The large area need for implementing the horizontal serpentine pattern of a high-value resistor is a practical limitation in an integrated circuit.

In the prior art, a capacitor 208 is implement as schematically shown in FIG. 1 in reference to two parallel planes 201 and 205. Each plane 201 and 205 contains a metalization layer or surface 204 and 207. The metals 204 and 207 are separated by an insulator. The capacitor 208 may conventionally frequently range from 1 nF to 100 nF and may occupy an area of perhaps 1.5 by 2.5 mm, however the actual value will be a function of the area of the parallel plates 204 and 207 in relation to their relative spacing from one another as is well known. In one typical integrated circuit process, parallel metalization levels are separated by a distance of approximately 1.5 microns. Because capacitance in a parallel plate capacitor is directly proportional to the size of the plates and inversely proportional to the distance between the plates, designs requiring high capacitance will require larger parallel metal plates and are, accordingly, often difficult to implement given the spacial limitations within the integrated circuit.

Preferably, resistors and capacitors are designed in a fully planarized fashion as illustrated by FIG. 1. The individual elements are set out in a horizontal plane with spacing allocated to the various elements on the plane. Accordingly, the layout of these on-chip resistors and capacitors requires the use of significant space within the integrated circuit. In complex integrated circuits, such as very large scale integration (VLSI) circuits, maximization of efficient use of spacing is often difficult to achieve. Accordingly, what is needed is a method for implementing resistance and/or capacitance within an integrated circuit while maximizing efficient use of spacing within the integrated circuit.

Additionally, prior art implementation of an inductor within an integrated circuit has been severely limited. Inductance is typically accomplished by mounting a separate coiled inductor exterior to the integrated circuit and connecting the inductor to the integrated circuit through metal leads. Alternatively, a thick short medullization layer was implemented on one of the planes above the silicon substrate in order to mimic both resistive and inductive properties within the integrated circuit. Unfortunately, neither of these methods provides for an effective inductor within an integrated circuit. Accordingly, what is further needed is a more efficient method for designing inductance within an integrated circuit while minimizing spatial requirements required for implementing such a design.

SUMMARY OF THE PRESENT INVENTION

The present invention is for a method of vertically implementing on-chip resistance, capacitance and/or inductance using stacked vias and metalization layers within the integrated circuit. Column shaped openings or vias are formed within the integrated circuit and connect from a silicon substrate to various metal traces. The vias are filled with conductive material such as tungsten. Parallel vias are used to form capacitance, while multiple vias and metal traces are arranged in various patterns over several planes in order to form resistance and/or inductance. The use of the stacked vias and metal traces in a vertical fashion reduces lateral spacing required to implement on-chip resistance, capacitance and/or inductance and allows for more efficient use of space in very large scale integration.

Other features and advantages of the invention will appear from the following description in which the preferred embodiments have been set forth in more detail, in conjunction with the accompanying drawings.

DESCRIPTION OF THE PREFERRED EMBODIMENT

Figure 1:
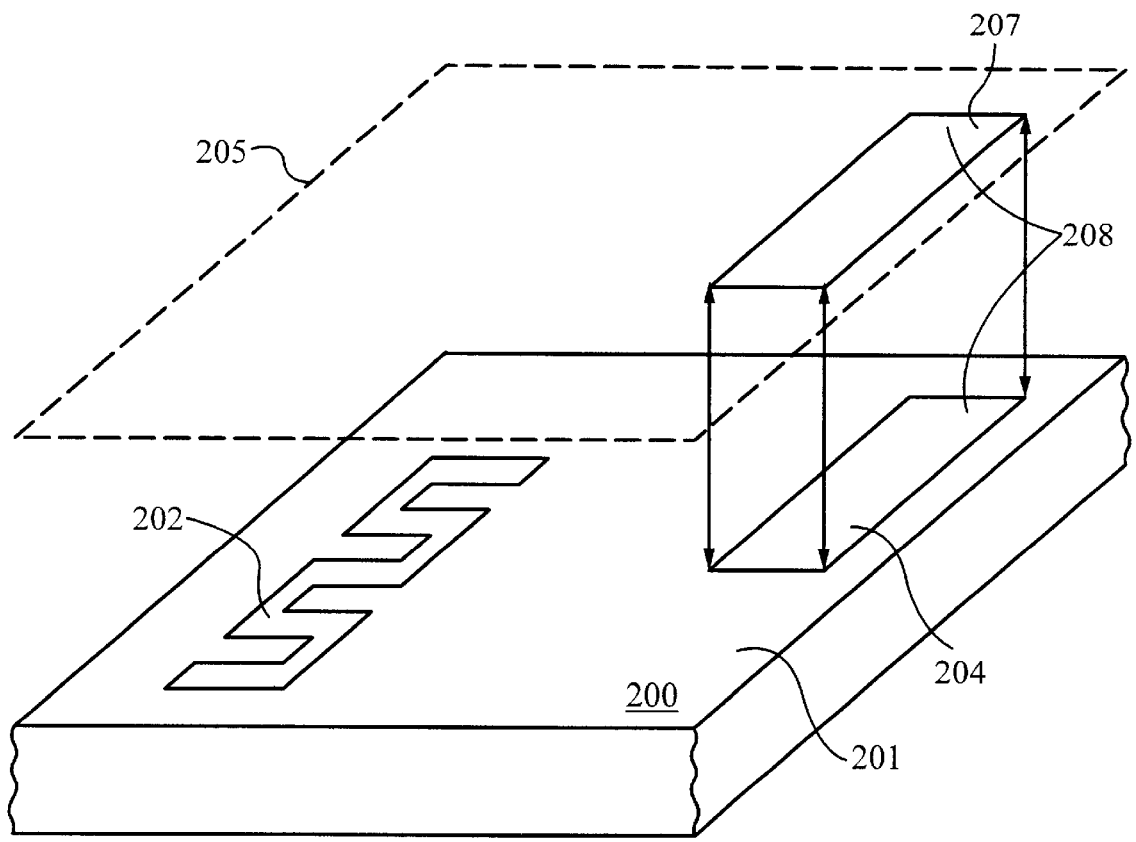
FIG. 1 shows a schematic representation of a planarized view of a prior art resistor and capacitor using a two metal layer integrated circuit according to the prior art.
Figure 2:
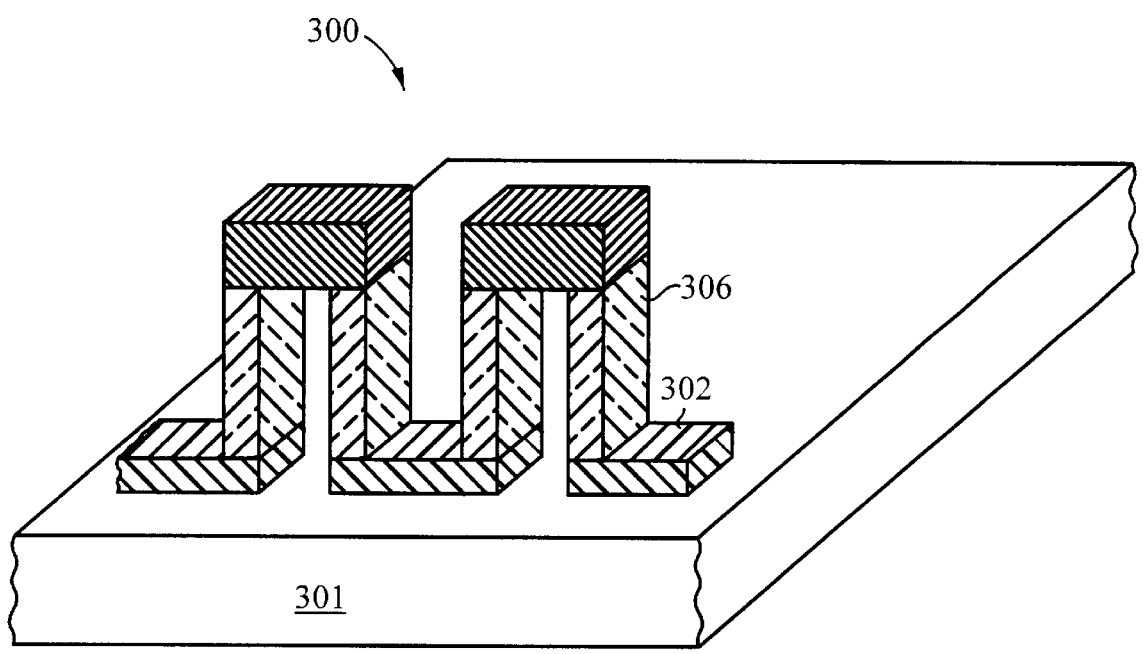
FIG. 2 shows an isometric view of resistor in portion of an integrated circuit according to the preferred embodiment of the present invention.
Figure 3:
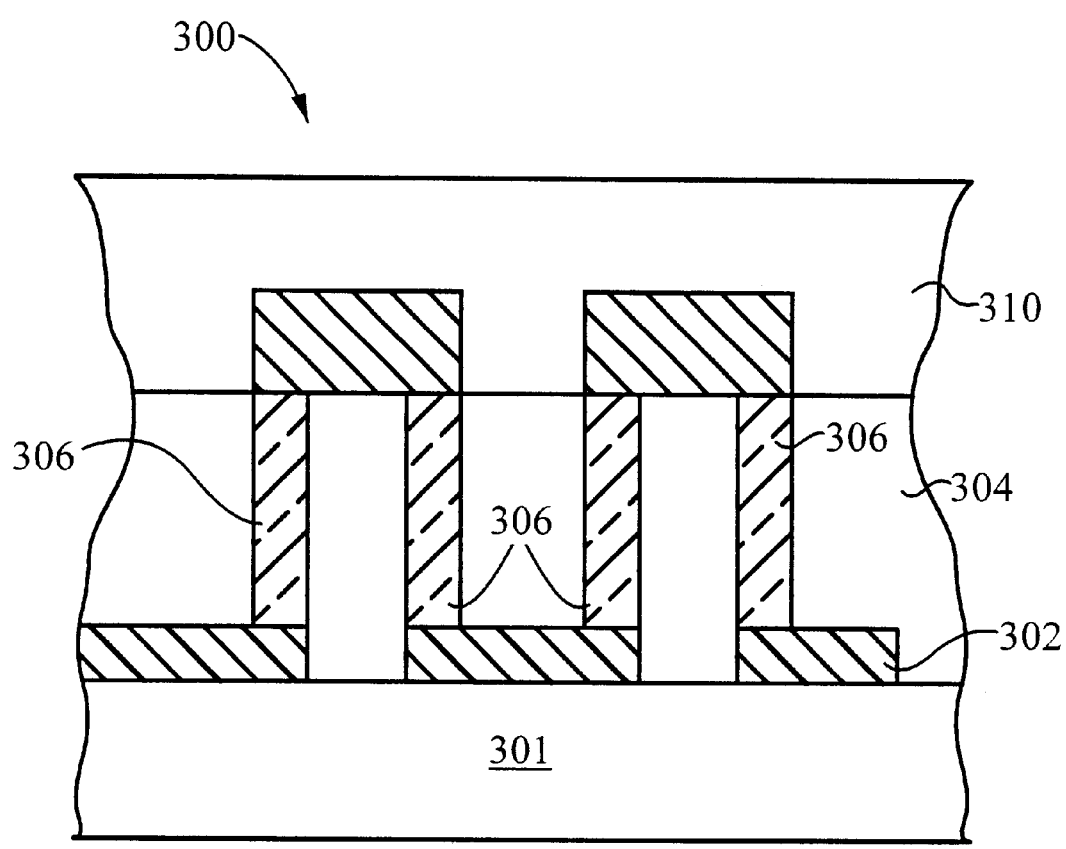
FIG. 3 shows a cross sectional view of the structure of FIG. 2.

FIG. 2 depicts an isometric view of a two metal layer integrated circuit which incorporates the method for implementing a resistance within the integrated circuit using multiple conductive layers and vias. FIG. 3 shows a cross sectional view of the structure of FIG. 2. The following description should be considered in reference to both FIG. 2 and FIG. 3. Generally, one or more devices are formed in the substrate 301 prior to the formation of a resistor using the techniques of the present invention. Those devices and their formation are ancillary to the present invention and are not discussed.

An integrated circuit 300 includes substrate 301 generally formed of silicon. These devices are formed by combining several layers of polysilicon materials to the silicon substrate 301 using techniques which are well known in the art of integrated circuit fabrication. At a planar level over the substrate 301 a conductive layer is formed, masked and etched into a series of discrete conductive elements 302. The discrete elements 302 can be formed of any conductive material including doped polysilicon, aluminum, an aluminum alloy, or a conductive metal. An insulator 304 is formed to envelop the discrete conductive elements 302. Contact openings are formed at appropriate locations through the insulator and vias 306 are formed in the openings using known techniques. Preferably the vias are formed of tungsten or a tungsten alloy. The vias 306 preferably make electrical contact with the respective ends of the discrete conductive elements 302.

The resulting structure is planarized using known techniques. Thereafter, a second conductive layer is formed, masked and etched into a second series of conductive elements 308 over the vias 306. The discrete elements 308 can be formed of any conductive material including doped polysilicon, aluminum, an aluminum alloy, or a conductive metal. An insulator 310 is formed to envelop and passivate the discrete conductive elements 308. The ends of the discrete conductive elements 308 preferably make electrical contact with the upper ends of the vias 306. In this way, the discrete conductive elements 302, the vias 306 and the discrete conductive elements 308 are electrically connected in a serial path.

The pathway is formed in a vertical serpentine pattern. It will be appreciated by one of ordinary skill in the art that the resistance of a contact between a via and a conductive trace is higher than the resistance of either the material of the trace or the via. The connection of the two different metallic substances increases the resistance. Accordingly, the resistance of the pathway is equal to sum of the resistance of each of the discrete conductive elements 302 (as calculated by its respective geometry times its $\Omega/\square$), plus the resistance of each via (as calculated by its respective geometry times its $\Omega/\square$), plus the resistance of each of the discrete conductive elements 308 (as calculated by its respective geometry times is $\Omega/\square$), plus the contact resistance. In the preferred embodiment, the vias 306 are separated by a distance of approximately 0.5 microns. Accordingly, use of the stacked vias to form a vertical serpentine pattern enables a resistor to be implemented within the integrated circuit without requiring as much lateral space. Therefore, higher resistance can be achieved in the integrated circuit without increased space requirements. Further, it will be apparent to one of ordinary skill in the art that the resistance can be increased by using structures having more than two layers of conductive interconnects, each vertical structure can be formed of multiple vias interconnecting the multiple layers of conductive interconnects without departing from the spirit and scope of the present invention.

Figure 4A:
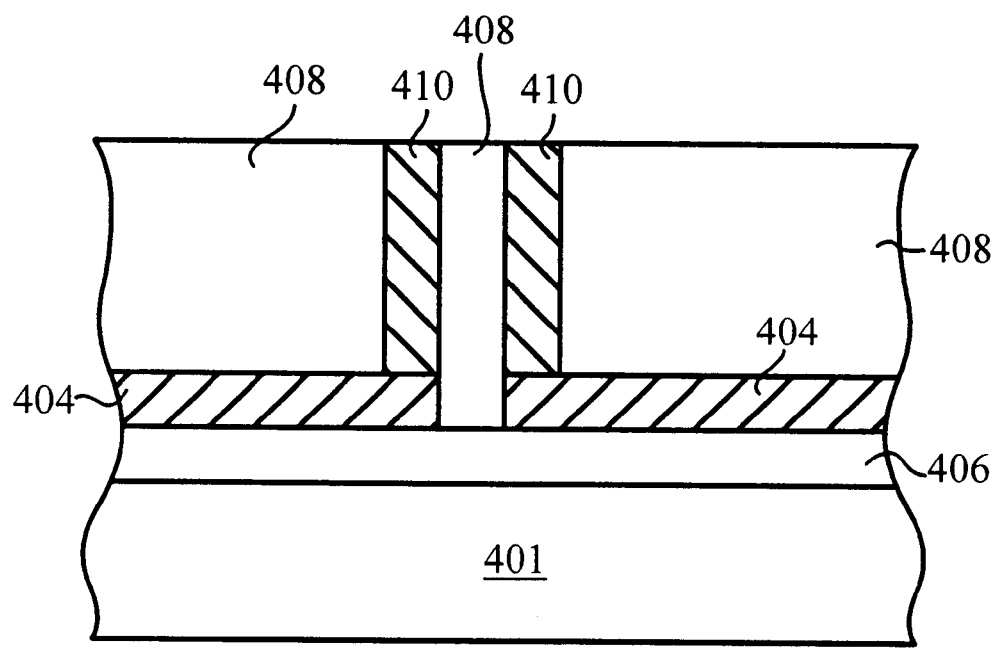
FIG. 4A shows a cross section of a capacitor within an integrated circuit, in accordance with the present invention.

FIG. 4A shows a cross section view of a capacitor within an integrated circuit, in accordance with the present invention. The integrated circuit is formed on a silicon substrate 401. Conductive traces 404 are formed over the substrate, generally over an insulator 406. The conductive traces 404 are preferably aluminum or an aluminum alloy. An insulator 408 is formed over the conductive traces 404. Openings are formed through the insulator and vias 410 are formed in electrical contact the conductive traces, one via 410 for each of the conductive traces 404. The vias 410 are preferably tungsten or a tungsten alloy. The vias 410 are configured to extend perpendicular to the plane of the drawing of FIG. 4A so that the area of the two conductive traces 410 facing one another can be large whereas the surface area used on the integrated circuit is small.

Figure 4B:
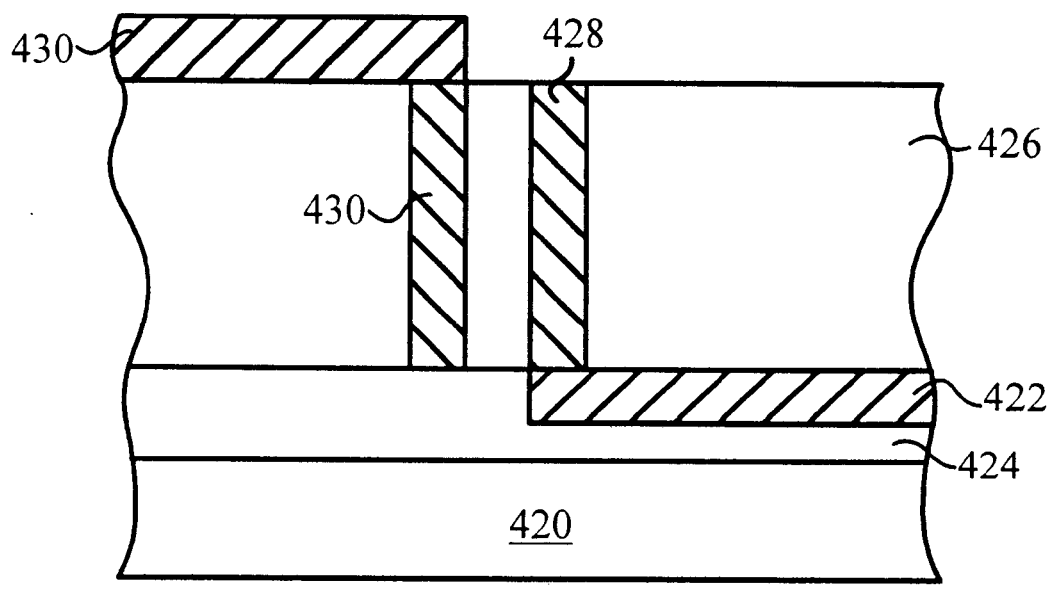
FIG. 4B shows a cross section of a capacitor within an integrated circuit, in accordance with an alternate embodiment of the present invention.

FIG. 4B shows a cross section view of a capacitor within an integrated circuit, in accordance with an alternative embodiment of the present invention. The integrated circuit is formed on a silicon substrate 420. A conductive trace 422 is formed over the substrate, generally over an insulator 424. The conductive trace 422 is preferably aluminum or an aluminum alloy. An insulator 426 is formed over the conductive trace 422. Openings are formed through the insulator and vias 428 and 430 are formed in the openings. One of the vias 428 is in electrical contact with the conductive trace 422. The upper surface is planarized and a second conductive trace 430 is formed in electrical contact with the other via 430. The vias 428 and 430 are preferably tungsten or a tungsten alloy. The vias 428 and 430 are configured to extend perpendicular to the plane of the drawing of FIG. 4b so that the area of the two conductive traces 428 and 430 facing one another can be large whereas the surface area used on the integrated circuit is small. It will be apparent to one of ordinary skill in the art that the capacitance can be increased in structures using by more than two layers of conductive interconnects, each vertical structure can be formed of multiple vias interconnecting the multiple layers of conductive interconnects without departing from the spirit and scope of the present invention.

Figure 5:
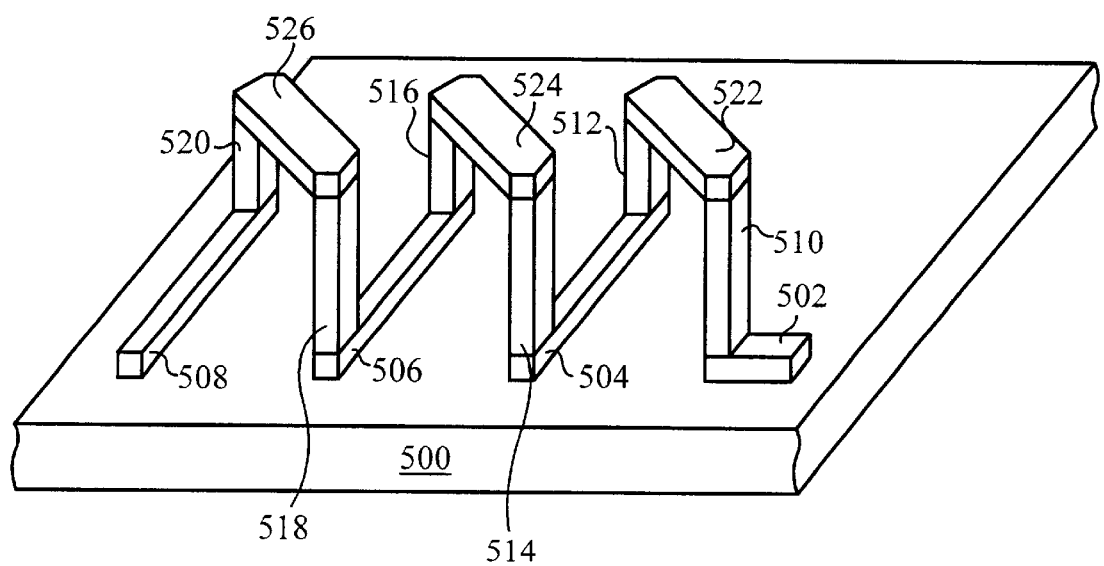
FIG. 5 shows a preferred embodiment for implementing inductance within an integrated circuit by using multiple stacked vias and metal layers arranged in a vertical winding pattern.

FIG. 5 is a partial isometric view of the implementation of inductance into an integrated circuit in accordance with the method of the present invention. As is well known, an inductor is formed from a coil of a conductor. The structure of FIG. 5 includes a three looped coil. The drawing of FIG. 5 shows the coil stretched out so that the relative geometries can be shown in the drawing to aid in understanding. It will be appreciated that a practical inductor made according to these teachings will be closely 'coiled' to enhance the inductance.

The inductor is formed on a substrate 500. A conductive layer is formed, masked and etched to form a plurality of discrete conductive elements 502, 504, 506 and 508. Preferably the conductive elements 502 through 508 are formed of aluminum or an aluminum alloy. An insulator (not shown) is formed over the conductive elements. Openings are formed through the insulator and vias 510, 512, 514, 516, 518 and 520 are formed through the openings. Fhe vias 510 through 520 are preferably formed of tungsten or a tungsten alloy. The resulting structure is planarized and another conducting layer is formed, masked and etched to form a plurality of discrete conductive elements 522, 524 and 526. The conductive elements 522 through 526 are preferably formed of aluminum or an aluminum alloy. The conductive element 502 is considered as a first end of the inductor coil. The lower end of the via 510 is electrically coupled to the conductive element 502. In practice, the conductive element 502 will also be coupled to other circuits on the integrated circuit which are not shown to avoid obscuring the invention in extraneous detail. The upper end of the via 510 is electically coupled to a first end of the conductive element 522. The second end of the conductive element 522 is electrically coupled to the upper end of a via 512. The lower end of the via 512 is electically coupled to a first end of a conductive element 504. The second end of the conductive element 504 is coupled to the lower end of a via 514. The upper end of the via 514 is electically coupled to a first end of the conductive element 524. The second end of the conductive element 524 is electrically coupled to the upper end of a via 516. The lower end of the via 516 is electically coupled to a first end of a conductive element 506. The second end of the conductive element 506 is coupled to the lower end of a via 518. The upper end of the via 518 is electically coupled to a first end of the conductive element 526. The second end of the conductive clement 526 is electrically coupled to the upper end of a via 520. The lower end of the via 520 is electically coupled to a first end of a conductive element 508. The second end of the conductive element 508 is the second end of the inductor coil. Accordingly, a multiple loop inductor can be implemented in the integrated circuit without requiring significant lateral spacing.

The on-chip method of resistance, capacitance and inductance (RLC) implementation of the present invention reduces the use of lateral spacing within the integrated circuit without requiring complicated design layout or significant circuitry to implement. Accordingly, the method of RLC implementation of the present invention is a superior technique for designing resistance, capacitance and/or inductance within an integrated circuit while reducing the use of lateral spacing within the integrated circuit.

While the present invention has been described in terms of a specific embodiments, such as specific materials, spacings, manufacturing techniques and utilizing two pairs of conductive vias for implementing capacitance, it will be apparent to those skilled in the art that modifications may be made in the specific embodiments chosen for illustration without departing from the spirit and scope of the invention as set forth in the appended claims. For example, multiple conductive vias may be used over alternating levels in an integrated circuit with more than three metal layers in order to accomplish resistance, capacitance or inductance.

What is claimed is:

1. A method of manufacturing passive resistors or capacitors within an integrated circuit wherein the resistors or capacitors are comprised of a plurality of interconnected vias and conductive layers within the integrated circuit for forming a vertical pattern to reduce circuit area.

2. The method of claim 1 wherein the method of forming a resistor in an integrated circuit comprises the steps of:
   a. providing a substrate;
   b. forming a first conductive layer positioned above the substrate and separated from the substrate by a dielectric;
   c. connecting a first via from a starting point for the resistor on the substrate to a first point on the first conductive layer;
   d. connecting a second via from a second point on the first conductive layer to an ending point for the resistor on the substrate;
   e. forming one or more additional conductive layers positioned above the first conductive layer and separated from the first conductive layer by a dielectric; and
   f. connecting a plurality of vias from one conductive layer to another conductive layer for forming a serpentine-patterned serial path.

3. The method for implementing a resistor as claimed in claim 2, wherein the conductive layers comprise of aluminum.

4. The method for implementing a resistor as claimed in claim 2, wherein the vias comprise tungsten.

5. The method of claim 1 wherein the method of forming a capacitor in an integrated circuit comprises the steps of:
   a. providing a substantially planar substrate;
   b. forming two substantially planar and parallel conductive vias which are perpendicular to the substrate, wherein each via is a plate of the capacitor; and
   c. coupling the vias each to an electrical signal.

6. The method of claim 1 wherein the method of forming a capacitor in an integrated circuit comprises the steps of:
   a. forming a substrate;
   b. forming at least one conductive layer positioned above the substrate and separated from the substrate by a dielectric;
   c. connecting a first via from a starting point for the capacitor on the substrate to a first point on the conductive layer;

d. connecting a second via from a second point on the conductive layer to an ending point for the capacitor on the substrate; and forming at least two substantially planar and parallel conductive vias which are perpendicular to the substrate, wherein each via is a plate of the capacitor, further wherein each via is coupled to the conductive layer.

7. The method of forming a capacitor as claimed in claim 6, wherein the conductive layer comprises aluminum.

8. The method of forming a capacitor as claimed in claim 6, wherein the vias comprise tungsten.

* * * * *